United States Patent

Gruber et al.

(10) Patent No.: US 10,520,563 B2
(45) Date of Patent: Dec. 31, 2019

(54) ADAPTIVE MR LOCAL COIL

(71) Applicants: Bernhard Gruber, Münzkirchen (AT);
Karsten Jahns, Buckenhof (DE);
Stephan Zink, Erlangen (DE)

(72) Inventors: Bernhard Gruber, Münzkirchen (AT);
Karsten Jahns, Buckenhof (DE);
Stephan Zink, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 119 days.

(21) Appl. No.: 15/278,531

(22) Filed: Sep. 28, 2016

(65) Prior Publication Data

US 2017/0089991 A1   Mar. 30, 2017

(30) Foreign Application Priority Data

Sep. 29, 2015  (DE) .................. 10 2015 218 749

(51) Int. Cl.
| | |
|---|---|
| *G01V 3/00* | (2006.01) |
| *G01R 33/34* | (2006.01) |
| *G01R 33/341* | (2006.01) |
| *H01F 6/06* | (2006.01) |
| *G01R 33/3415* | (2006.01) |

(52) U.S. Cl.
CPC ..... *G01R 33/34084* (2013.01); *G01R 33/341* (2013.01); *G01R 33/34007* (2013.01); *G01R 33/3415* (2013.01); *H01F 6/06* (2013.01)

(58) Field of Classification Search
CPC ............................................. G01R 33/34084
USPC ................................................. 324/318, 322
See application file for complete search history.

(56) References Cited

U.S. PATENT DOCUMENTS

| | | | |
|---|---|---|---|
| 4,859,947 A | 8/1989 | Boskamp | |
| 4,897,604 A * | 1/1990 | Carlson ............ | G01R 33/34053 324/318 |
| 5,327,898 A * | 7/1994 | Yoshino ............ | G01R 33/3678 324/318 |
| 5,594,339 A | 1/1997 | Henderson et al. | |
| 7,619,416 B2 | 11/2009 | Nordmeyer-Massner et al. | |
| 8,552,299 B2 | 10/2013 | Rogers et al. | |
| 8,797,030 B2 | 8/2014 | Alagappan et al. | |
| 9,002,431 B2 | 4/2015 | Jones | |
| 9,255,977 B2 * | 2/2016 | Biber ................. | G01R 33/36 |
| 9,453,894 B2 * | 9/2016 | Bulumulla ....... | G01R 33/34007 |
| 2007/0152789 A1 | 7/2007 | Watanabe | |

(Continued)

FOREIGN PATENT DOCUMENTS

| | | |
|---|---|---|
| CN | 87108042 A | 6/1988 |
| CN | 101017722 A | 8/2007 |

(Continued)

OTHER PUBLICATIONS

European Search Report for European Application No. 16182574.0-1568, dated May 29, 2017 with English Translation.

(Continued)

*Primary Examiner* — Louis M Arana
(74) *Attorney, Agent, or Firm* — Lempia Summerfield Katz LLC (57) ABSTRACT

An adaptive magnetic resonance (MR) local coil includes at least one conductor structure. The at least one conductor structure is electrically conductive. The at least one conductor structure is at least partially ductile and/or pliable.

20 Claims, 5 Drawing Sheets

(56) References Cited

U.S. PATENT DOCUMENTS

| | | | |
|---|---|---|---|
| 2008/0204021 A1* | 8/2008 | Leussler | G01R 33/3415 324/318 |
| 2009/0261828 A1* | 10/2009 | Nordmeyer-Massner | G01R 33/34046 324/318 |
| 2010/0264927 A1 | 10/2010 | Viswanathan | |
| 2012/0092012 A1 | 4/2012 | Viswanathan | |
| 2012/0280687 A1 | 11/2012 | Popescu | |
| 2013/0093425 A1 | 4/2013 | Chu et al. | |
| 2013/0137969 A1 | 5/2013 | Jones | |
| 2013/0184566 A1 | 7/2013 | Kreischer et al. | |
| 2013/0225980 A1 | 8/2013 | Biber et al. | |
| 2013/0320981 A1 | 12/2013 | Bulumulla et al. | |

FOREIGN PATENT DOCUMENTS

| | | |
|---|---|---|
| DE | 102010043134 A1 | 5/2012 |
| DE | 102011080046 A1 | 1/2013 |
| DE | 102012109942 A1 | 4/2013 |
| DE | 102012200599 A1 | 7/2013 |
| DE | 102012203083 A1 | 8/2013 |
| EP | 1906195 A1 | 4/2008 |
| EP | 2110680 A1 | 10/2009 |
| JP | H0226536 | 1/1990 |
| JP | 2001070276 | 3/2001 |
| KR | 20080009043 A | 1/2008 |
| KR | 20130029747 A | 3/2013 |
| WO | WO2005124380 A2 | 12/2005 |

OTHER PUBLICATIONS

Korean Office Action for Korean Application No. 10-2016-0124820, dated Apr. 28, 2017, with English Translation.

Amohr: Insulated Flat Conductor, Elastic, http://www.amohr.com/products/conductive-tapes/, May 25, 2015.

German office Action for related German Application No. 10 2015 218 749.7 dated Aug. 12, 2016, with English Translation.

Sekitani, T. et. al.: "A Rubberlike Stretchable Active Matrix Using Elastic Conductors", Science, vol. 321, pp. 1468-1472, Dec. 9, 2008.

Zhao, Y. et. al.: "Iodine doped carbon nanotube cables exceeding specific electrical conductivity of metals", in: Scientific Reports,, vol. 1, Nr. 83, pp. 1-5, DOI: 10.1038/srep00083; 2011.

Chinese Office Action for Chinese Application No. 201610867478.3 dated Jan. 4, 2019, with English Translation.

* cited by examiner

ADAPTIVE MR LOCAL COIL

This application claims the benefit of DE 10 2015 218 749.7, filed on Sep. 29, 2015, which is hereby incorporated by reference in its entirety.

BACKGROUND

The present embodiments relate to an adaptive MR local coil.

In medical engineering, imaging methods are an important tool. Thus, for example, in clinical sectional imaging, imaging by magnetic resonance (MR) (e.g., magnetic resonance tomography (MRT)) is characterized by high and variable soft tissue contrasts. High-frequency electromagnetic resonance signals are received by electrically conducting loops, coils, and/or antennae. In the process, a voltage is induced in the coil by the magnetic resonance signal. These receive coils may be arranged as closely as possible to an object under examination (e.g., a patient). The receive coils may therefore also be local coils. The induced voltage may be forwarded to the receiving electronics reinforced by a low-noise preamplifier.

Originally, arrays with as many small antennae as possible were introduced to improve the Signal-to-Noise-Ratio (SNR) of the received magnetic resonance signal. The SNR may be negatively influenced by the losses in the antennae, a poor fill factor, and possible user errors (e.g., overlaps).

Now, arrays are used, for example, for parallel imaging techniques such as, for example, GeneRalized Autocalibrating Partially Parallel Acquisitions (GRAPPA) and/or SENSitivity Encoding (SENSE). From this, a reduction of a measurement period may be obtained, which is to be provided for the examination of the object under examination. Multichannel arrays, the antennae of which may have different types of spatial alignment relative to the transmission field, are thus to be provided.

SUMMARY AND DESCRIPTION

The scope of the present invention is defined solely by the appended claims and is not affected to any degree by the statements within this summary.

User-friendly handling and good SNR are prerequisites for an optimum result and become more difficult with an increasing number of antennae. Today, there are various types of local coil, usually for particular anatomical regions such as, for example, the head, knee, chest, heart, prostate, ankles, wrists and shoulder. However, with the local coils of today, there is generally room for improvement in terms of adaptation to a specific patient shape, as the local coils are often designed for an average patient shape. For example, this results in reduced fill factors and/or increased connections and consequently in a poorer SNR.

The present embodiments may obviate one or more of the drawbacks or limitations in the related art. For example, improved geometric adaptability of a local coil to different shapes of an object under examination is enabled.

The local coil includes at least one conductor structure. The at least one conductor structure is electrically conductive, where the at least one conductor structure is at least partially ductile and/or pliable.

The at least one conductor structure may be surrounded by one or more antennae. The one or more antennae may be surrounded by an antenna array. The local coil may include a plurality of conductor structures that may be arranged to overlap at least partially.

The electrical conductivity of the at least one conductor structure may be at least $10^3$ S/m, at least $10^5$ S/m, or at least $10^7$ S/m. As a result, a voltage may be efficiently induced in the one or more antennae by magnetic resonance signals. The at least one conductor structure may be in the shape of a loop (e.g., the conductor structure may be surrounded by a coil loop). As a result, the at least one conductor structure may act as an induction loop and/or magnetic antenna. The at least one conductor structure may therefore be configured for the transmission and receipt of magnetic resonance signals.

In one embodiment, the at least one conductor structure is ductile and/or pliable in at least one or at least two (e.g., in all three) spatial directions that are optionally oriented perpendicular to each other.

As a result of the ductility and/or pliability of the at least one conductor structure, a high geometric adaptability to the shape of any object under examination may be obtained. For example, the at least one conductor structure may be configured to change shape reversibly (e.g., the shape of the at least one conductor structure may assume different geometric states that may be converted into each other repeatedly). For example, the length and/or the size of the at least one conductor structure may be altered as a result of the ductility. Advantageously, the at least one conductor structure remains as a whole in the process.

Advantageously, the local coil is therefore configured such that the local coil may be adapted by changing the size and/or the shape of the antennae and/or by changing the relative position of the antennae to each other to the shape of an object under examination. As a result, regardless of the shape and size of the object under examination (e.g., of a body part of a patient for examination), the one or more antennae and the whole local coil may be positioned as close as possible to the surface of the object under examination (e.g., as a result of geometric adaptability, the fill factor (i.e., the filling of a volume enclosed by the local coil by the object under examination) may be optimized). This results advantageously in increased sensitivity and a raised SNR.

Ductility may, for example, be achieved by the at least one conductor structure including carbon nanotubes. The use of carbon nanotubes permits the production of elastic electrical conductors (e.g., an electrically conductive material that gives rise to the electrical conductivity of the at least one conductor structure is ductile and/or elastic). For example, the at least one conductor structure may return to an original shape after exposure to a force. The conductor structures including carbon nanotubes may be stretched by at least 30%, at least 60%, or at least 100% without being damaged mechanically or electrically.

The at least one conductor structure includes single strands and/or solid wires. A single strand may include a thin single wire, the diameter of which may be at least as great as skin depth (e.g., the depth of penetration due to the skin effect). The skin depth is, inter alia, dependent on the magnetic field, which may be between 1.5 and 7 T. An excessively large diameter restricts the flexibility and/or pliability of the single strand. The diameter of a single strand may therefore be between 3 and 80 µm or between 5 and 40 µm.

For example, several single strands may produce one strand that has high mechanical flexibility with low electrical resistance per length unit. The single strands and/or solid wires may, for example, include copper and/or coated copper conductors.

In one embodiment, the at least one conductor structure has at least one textile fabric (e.g., a woven fabric and/or a crocheted and/or knitted fabric and/or a mesh). For example, the at least one textile fabric may be woven and/or crocheted and/or knitted and/or braided and/or twisted, etc. The at least one textile fabric may, for example, be an intertwined arrangement of several strands of pliable material (e.g., of metal wires and/or cores). The textile fabric may therefore, for example, include a wire mesh.

The at least one textile fabric may, for example, be spatial (e.g., tubular) in design. A spatial embodiment of the textile fabric may provide that the textile fabric includes an enclosed arrangement in a cross-section of the direction of a cable. The enclosed arrangement may, for example, be circular or oval in design. The direction of the cable may be the direction in which an electric current (e.g., an electric net flow) may be induced.

The at least one textile fabric may also be flat in design. A flat embodiment of the textile fabric may provide that the textile fabric has an open arrangement in a cross-section of the direction of the cable. The open arrangement may include a first end and a second end, where the first end and the second end are spaced apart from each other. The open arrangement may, for example, be linear in design.

In one embodiment, the at least one textile fabric includes a surface in a flat embodiment. In one embodiment, the spatial extension of the at least one textile fabric in a flat embodiment in a first direction that, for example, is aligned perpendicular to the surface, is significantly smaller (e.g., four times smaller or ten times smaller) than the spatial extension in orthogonal directions to the first direction. For example, the direction of the cable is orthogonal to the first direction.

Using a flat embodiment, simple embodiments with particularly good stretching properties may be realized.

In the event that the surface of the flat textile fabrics is oriented perpendicular to the plane of a coil loop, the flat textile fabric exhibits a particularly high degree of flexibility. In contrast to a spatial (e.g., tubular) embodiment, a flat textile fabric perpendicular to a zero line that may also be designated as neutral fiber and may run parallel to the first direction, has a small extension so that when the shape of the conductor structure changes, smaller compressions and/or elongations and/or smaller bend allowances and/or bend extensions occur. This increases the pliability and reduces the risk of kinking.

The surface of a flat textile fabric may, however, naturally also be oriented parallel to the plane of the coil loop and/or be inclined at any angle to the plane of the coil loop. For example, the orientation of the flat textile fabric to the plane of the coil loop may vary in sections.

Advantageously, the at least one textile fabric therefore has high ductility and/or pliability. As a result of this, flexible geometric adaptation of the local coil may be provided.

The local coil also includes several conductor structures that have the same preferred direction. For example, the multiple conductor structures may be arranged in parallel to each other. As a result of a common preferred direction, systematic coverage of the object under examination may be achieved. The multiple conductor structures may therefore be arranged at regular intervals in a straightforward manner. In addition, the multiple conductor structures may be spaced at different intervals, enabling improved adaptability of the local coil.

In one embodiment, the local coil includes multiple conductor structures in a crossed (e.g., lattice-shaped) arrangement. As a result, for example, geometrically flexible mats and/or fabric that may easily be adapted to different shapes may be produced.

One embodiment provides that the local coil includes at least one, for example, electrically insulating supporting structure.

The electrically insulating carrier material may have electrical conductivity of less than 1 S/m. The supporting structure may support the at least one conductor structure. In other words, the supporting structure may serve as a framework for the at least one conductor structure. The design possibilities and/or adjustment possibilities of the local coil shape may be increased by the at least one supporting structure.

The at least one supporting structure is compatible with MR imaging. For example, the supporting structure includes a material that is MR-muted and does not absorb any MR signals.

In one embodiment, the at least one supporting structure is at least partially ductile and/or pliable.

A ductile conductor loop may be realized by a combination of an at least partially ductile and/or pliable supporting structure with a conductor structure.

In order to enable a ductile overall arrangement, only part of the supporting structure may be ductile and/or pliable. In other words, the supporting structure may also include rigid elements.

In one embodiment, the at least one conductor structure is arranged on the at least one supporting structure (e.g., woven around the at least one supporting structure and/or entwined and/or enmeshed, etc.). The at least one conductor structure and the at least one supporting structure may therefore jointly have a textile fabric. These embodiments enable a high level of mechanical adaptability.

One embodiment provides that the local coil includes a plurality of supporting structures that are arranged in parallel to each other. Such a structure is particularly suitable for geometric adaptation to longitudinal objects under examination such as, for example, arms and/or legs.

In one embodiment, the at least one conductor structure has a zigzag-shaped and/or meandering course. Conductor structures with such courses are especially easy to elongate and/or compress and thus especially easy to adapt to different patient anatomies.

One embodiment provides that the at least one conductor structure may be arranged on a cylinder (e.g., a circular cylinder). In one embodiment, the circular cylinder encompasses a volume in which an object under examination (e.g., a body part of a patient such as, for example, a leg and/or an arm) may be recorded.

In one embodiment, the at least one conductor structure is flexible at least in sections. For example, the at least one conductor structure has at least one spring. In one embodiment, the at least one supporting structure includes up to six springs, up to four springs, or up to two springs.

A flexible arrangement provides a good opportunity for anatomical adjustment as a result of the ductility of springs and recoil strength of the springs. With a partial spring arrangement (e.g., an arrangement that includes flexible and rigid areas in sections), a robust but on the whole flexible and ductile conductor structure may be produced. The electrical conductivity of the conductor structure may be influenced by the material of which the springs are composed. As a result, the quality of any antenna that includes the conductor structure may also be influenced.

The springs themselves may be configured in different shapes such as, for example, a coil spring and/or a conical spring and/or a telescopic spring and/or a flat spring. A coil spring may have a helical course (e.g., the course describes a curve that coils around the casing of a cylinder). For example, a round wire and/or a flat wire may be used. A conical spring may have a conical course (e.g., the path describes a curve that coils around the casing of a cone). A flat spring may have a flexible structure that passes onto a plane, while the flexible structure may include a meandering wire. Such types of spring are particularly suitable, as the spring usually exhibits good availability and high ductility.

The local coil may include at least one protective sleeve that is arranged around the at least one conductor structure. The protective sleeve may have a diameter of up to 10 mm or up to 5 mm.

The local coil may include at least one matching circuit. By stretching the at least one supporting structure, altered impedance and/or natural frequency may be obtained. The impedance on an input of any preamplifier may also change due to different loading of the at least one conductor structure, interactions between the at least one conductor structure and an object under examination, and a connection between several conductor structures. These changes in impedance and/or frequency shifts may be compensated by the at least one matching circuit. As a result, the noise behavior (e.g., a noise ratio) of any preamplifier that is heavily dependent on the impedance at the input and a measurement frequency may be improved, and a higher SNR may be obtained.

A magnetic resonance device with a local coil according to one or more of the present embodiments is also provided. The advantages of the magnetic resonance device essentially correspond to the advantages of the local coils that were described in detail above.

BRIEF DESCRIPTION OF THE DRAWINGS

Further advantages, features, and details of the invention are revealed by the exemplary embodiments described hereinafter and with reference to the diagrams. Corresponding parts have the same reference characters in all the figures.

DETAILED DESCRIPTION

Figure 1:
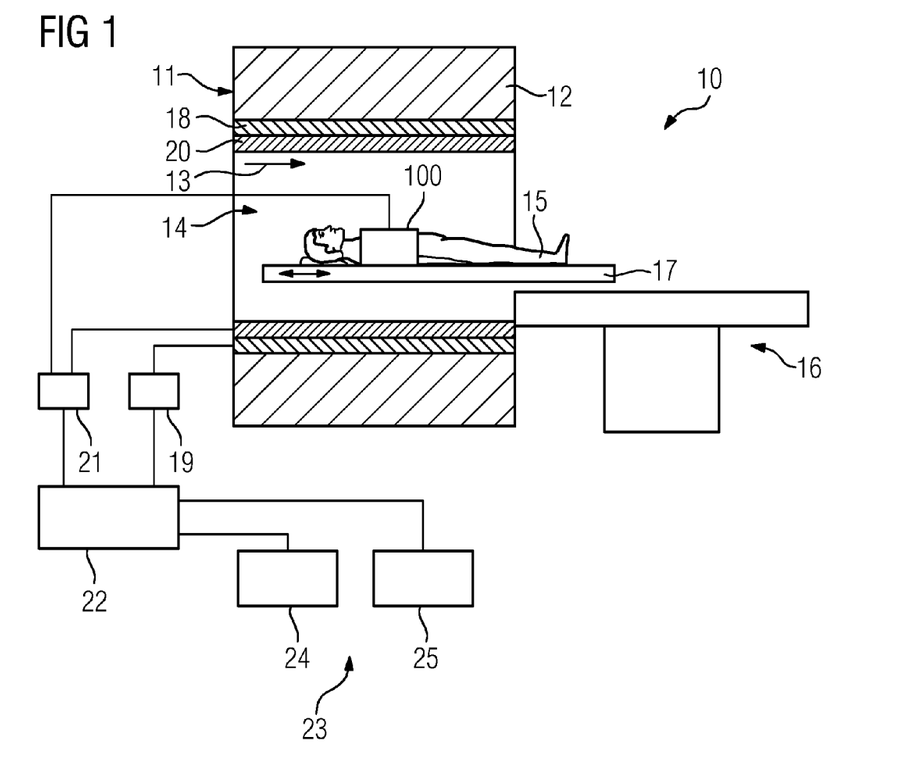
FIG. 1 shows a diagrammatic view of one embodiment of a magnetic resonance device.

FIG. 1 is a diagrammatic view of a magnetic resonance device 10. The magnetic resonance device 10 includes a magnet unit 11 that has a superconducting main magnet 12 for generating a strong and, for example, time-constant main magnetic field 13. In addition, the magnetic resonance device 10 includes a patient reception area 14 for receiving a patient 15. The patient reception area 14 in the present exemplary embodiment is cylindrical and cylindrically enclosed in a peripheral direction from the magnet unit 11. A differing embodiment of the patient reception area 14 may, however, by provided at any time. The patient 15 may be pushed into the patient reception area 14 by a patient positioning device 16 of the magnetic resonance device 10. The patient positioning device 16 has a mobile patient table 17 inside the patient reception area 14 for this purpose.

The magnet unit 11 has a gradient coil unit 18 for the generation of magnetic field gradients. The gradient coil unit 18 is used for spatial encoding during imaging. The gradient coil unit 18 is controlled by a gradient control unit 19 of the magnetic resonance device 10. The magnet unit 11 includes a high-frequency antenna unit 20 that is permanently integrated in the magnetic resonance device 10 in the present exemplary embodiment. The high-frequency antenna unit 20 is configured for the excitation of atomic nuclei, which occurs in the main magnetic field 13 of the main magnet 12. The high-frequency antenna unit 20 is controlled by a high-frequency antenna controller 21 of the magnetic resonance device 10 and emits high-frequency magnetic resonance sequences into an examination area essentially constituted by a patient reception area 14 of the magnetic resonance device 10. The high-frequency antenna unit 20 is configured to receive magnetic resonance signals.

To control the main magnet 12, the gradient control unit 19, and the high-frequency antenna controller 21, the magnetic resonance device 10 has a system controller 22. The system controller 22 controls the magnetic resonance device 10 centrally (e.g., the performance of a predetermined imaging gradient-echo sequence). In addition, the system controller 22 includes an evaluation unit not shown in more detail for the evaluation of medical imaging data that is recorded during the magnetic resonance examination. The magnetic resonance device 10 includes a user interface 23 that is connected to the system controller 22. Control information such as, for example, imaging parameters, and reconstructed magnetic resonance images may be displayed on a display unit 24 (e.g., at least one monitor) of the user interface 23 for medical operating personnel. The user interface 23 has an input unit 25 by which the information and/or parameters may be entered by the medical operating personnel during a measurement procedure.

The magnetic resonance device 10 includes a local coil 100 that is arranged in the chest area of the patient 15 in this example. The local coil 100 includes at least one electrically conductive conductor structure, where the at least one conductor structure is at least partially ductile and/or pliable. Like the high-frequency antenna unit 20, the local coil 100 is configured for the excitation of atomic nuclei and the reception of magnetic resonance signals and is controlled by the high-frequency antenna controller 21.

The magnetic resonance device 10 shown in the present exemplary embodiment may include additional components that are usually included in magnetic resonance devices. In addition, the general functionality of a magnetic resonance device 10 is known to a person skilled in the art, thus dispensing with the need for a detailed description of the general components.

Figure 2:
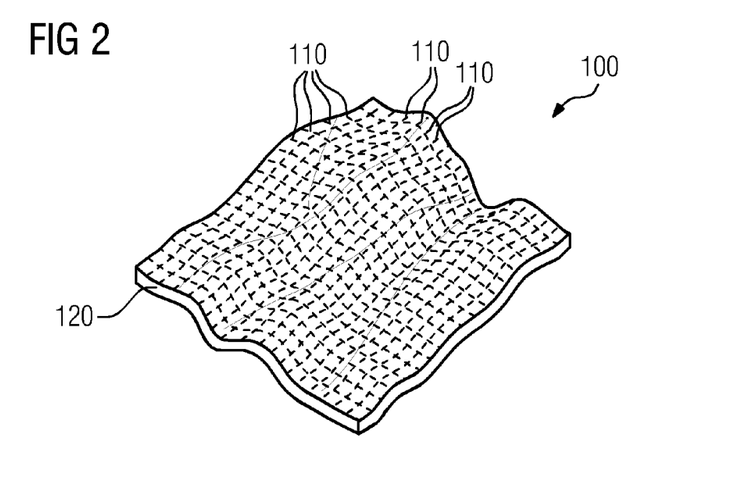
FIG. 2 shows a diagrammatic view of one embodiment of a local coil with several conductor structures that are crossed over.

FIG. 2 shows an exemplary embodiment in which the local coil 100 includes several conductor structures 110 and a supporting structure 120, where the conductor structures 110 are only partially assigned reference characters for improved transparency. The conductor structures 110 are configured as a geometrically adjustable grid (e.g., the conductor structures 110 are crossed over). The grid may easily adapt to the anatomy of the patient 15. The material constituting the conductor structures 110 is itself advantageously ductile and/or elastic for this purpose. Elastic materials that are highly electrically conductive at the same time include, for example, carbon nanotubes. The grid may, for example, include braided and/or woven electrical conductors. The grid is bordered by a supporting structure 120 that lends the structure stability. In order not to impede the adaptability of the overall arrangement, the supporting structure 120 is also at least partially ductile and/or pliable.

Figure 3:
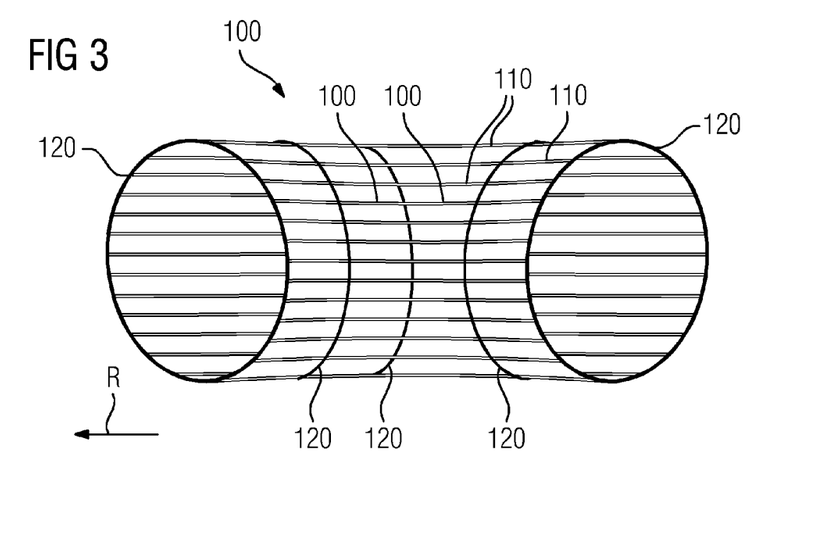
FIG. 3 shows a diagrammatic view of one embodiment of a local coil with several conductor structures that are arranged on a circular cylinder.

FIG. 3 shows a further exemplary embodiment of a local coil 100 with several conductor structures 110 in the same preferred direction R that may be arranged on a cylinder. Inside this cylinder, an object under examination (e.g., a longitudinal object under examination such as an arm or a leg) may be positioned. A number of conductor structures 110 display the same preferred direction R.

The local coil 100 has supporting structures 120 that pass around the conductor structures 110. The supporting structures 120 are, for example, arranged in parallel to each other. The supporting structures 120 may be advantageously contracted (e.g., the supporting structures 120 may act as a belt). As a result, the conductor structures 110 may be arranged close to the object under examination, enabling the achievement of a higher fill factor.

Textile structures are also suitable for the realization of ductile and/or pliable conductor structures, as shown in an exemplary manner in FIGS. 4 to 9. The double arrows illustrate the possible stretching direction of the textile fabric. Textile fabrics may include electrical conductors such as, for example, pure copper conductors, coated copper conductors, or conductors of other metals. In addition, the conductor structures may have single strands and/or solid wires. The flexibility, ductility and/or adaptability are produced by the textile arrangement of the conductors.

Figure 4:
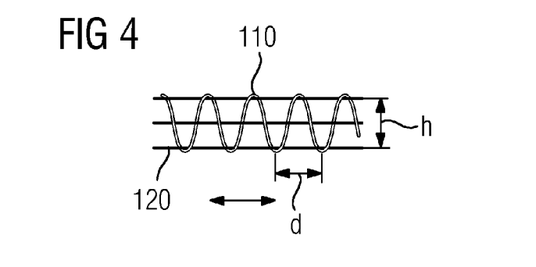
FIG. 4 shows a diagrammatic view of a section of one embodiment of a conductor structure with a textile fabric.

FIG. 4 shows an example of a textile fabric in which a conductor structure 110 is arranged on a supporting structure 120. The conductor structure 110 is woven into the supporting structure 120 and has a zig-zag shaped and/or meandering course.

The shape of the textile fabric may be configured such that a distance d between two recurring sections is between 4 to 6 mm, and a height d of the recurring section is between 5 to 7 mm.

The supporting structures 120 are advantageously ductile and/or elastic. For this purpose, the supporting structures 120 may include ductile and/or elastic materials such as, for example, rubber. The supporting structures 120 may therefore, for example, include elastic bands. The supporting structures 120 do not need to be conductive themselves, as the conductivity of the overall arrangement is obtained by the conductor structures 110.

Figure 5:
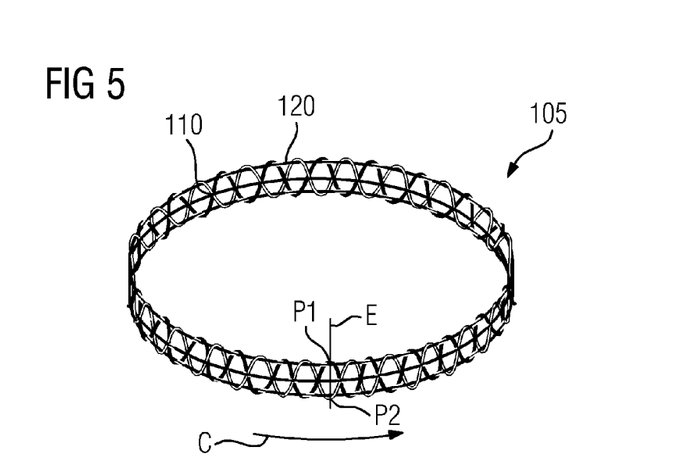
FIG. 5 shows a diagrammatic view of one embodiment of a loop-shaped conductor structure with a textile fabric.

A textile fabric, as illustrated in an exemplary manner in FIG. 4, may be arranged in the shape of a loop, as shown in an exemplary manner in FIG. 5. The arrangement 105 shown in FIG. 5 includes a conductor structure 110. This conductor structure 110 has a textile fabric including two conductors that are arranged on a supporting structure 120. The loop may assume different stretching states (e.g., the surface enclosed by the loop may be changed). As a result, good adaptability of the loop to different patient shapes is obtained.

Figure 6:
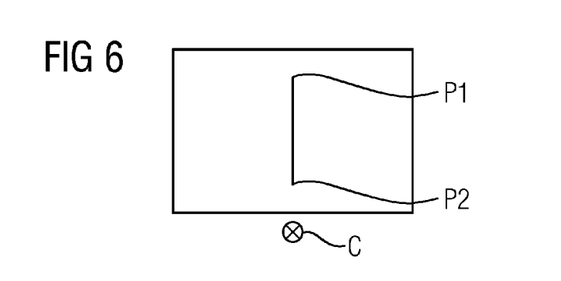
FIG. 6 shows a diagrammatic view of a cross-section of one embodiment of a flat textile fabric.

The conductor structure shown in FIG. 5 has a textile fabric that is flat in design (e.g., in a cross-section that is shown in strongly diagrammatic form in FIG. 6, the textile fabric has an open arrangement in the direction of the cable C). The cross-section is located, for example, on the plane E. The direction of the cable C may be a direction in which an electric current may flow that, for example, may be induced by magnetic resonance signals. The open arrangement includes a first end P1 and a second end P2, where the first end P1 and the second end P2 are set apart from each other. The open arrangement may be linear.

The surface of the textile fabric may be essentially perpendicular to the plane of the coil loop. The plane of the coil loop may be the plane on which the direction of the cable C is located. This provides that the connecting line between the points P1 and P2 is essentially perpendicular to the plane of the coil loop and to the direction of the cable C. In this embodiment, the flat textile fabric displays a particularly high level of flexibility, as the flat textile fabric has a slight extension perpendicular to a zero line so when there is a change in the shape of the conductor structure 110, fewer compressions and/or stretches and/or fewer bend allowances and/or bend extensions occur.

The surface of a flat textile fabric may naturally also be parallel to the plane of the coil loop and/or inclined at any angle to the plane of the coil loop. For example, the orientation of the surface of the flat textile fabric to the plane of the coil loop may vary in sections.

Figure 7:
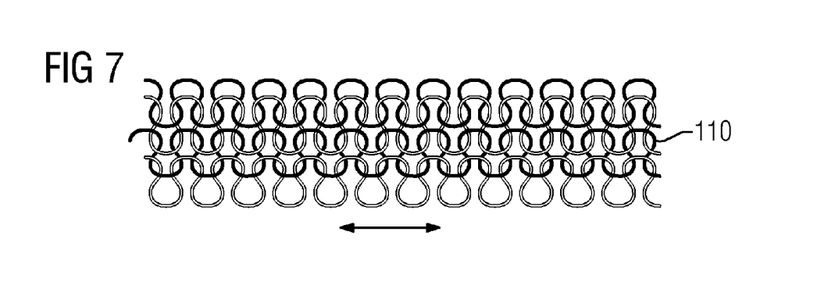
FIG. 7 shows a diagrammatic view of a section of one embodiment of a conductor structure with a knitted structure.
Figure 8:
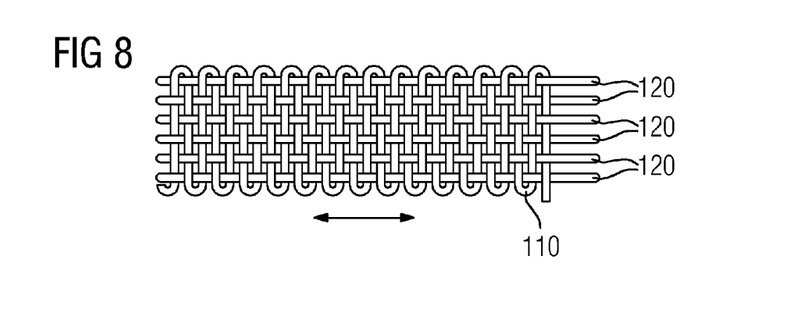
FIG. 8 shows a diagrammatic view of a section of one embodiment of a conductor structure with a woven structure.

Examples of additional types of textile fabric are shown in FIGS. 7 and 8. While in FIG. 7 a knitted conductor structure is shown, FIG. 8 shows a woven conductor structure. FIG. 8 shows an example in which, similar to the example shown in FIG. 4, a conductor structure 110 is woven around a supporting structure 120.

Figure 9:
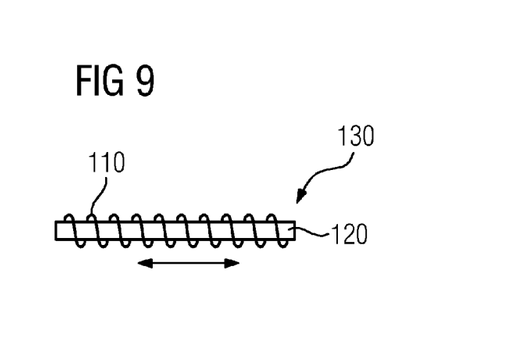
FIG. 9 shows a diagrammatic view of a section of one embodiment of a conductor structure with a twisted structure.
Figure 10:
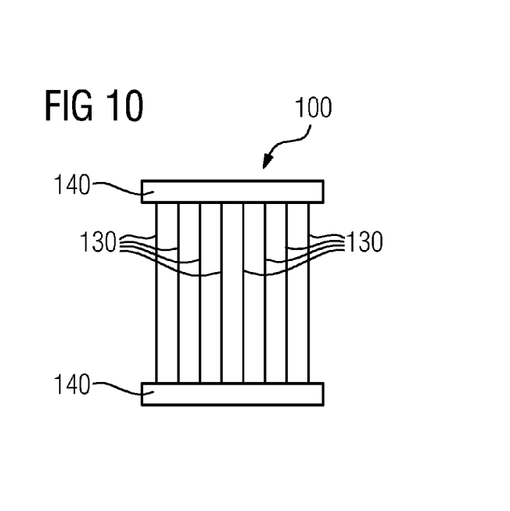
FIG. 10 shows a diagrammatic view of one embodiment of a cuff-shaped local coil.

In contrast, in a further example shown in FIG. 9, a supporting structure 120 such as, for example, a rubber band or another ductile band is woven around a conductor structure 110. Together the supporting structure 120 and the conductor structure 110 form an electrically conductive and at the same time ductile and/or elastic cord 130 that, for example, may be used to realize a local coil 100 in the shape of an adaptive cuff, as shown in FIG. 10. Apart from the cords 130, which are arranged in parallel to each other, the local coil includes fastening elements 140 with which the local coil may be attached to a patient 15.

Figure 11:
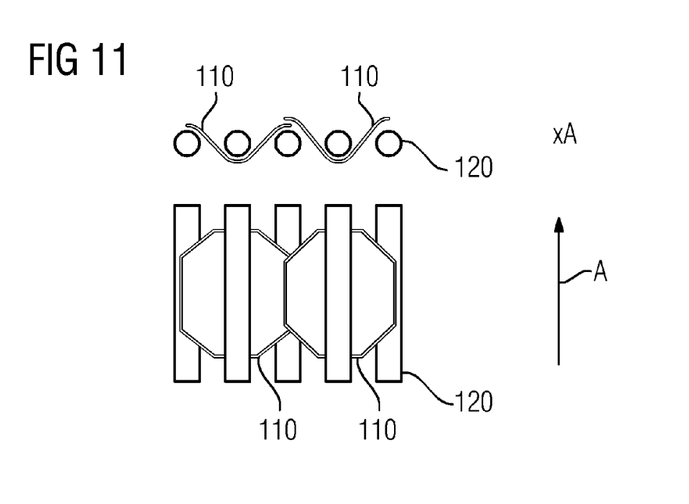
FIG. 11 shows a diagrammatic view of one embodiment of a cuff-shaped local coil.

A further example of an adaptive local coil structure is shown in FIG. 11. The arrangement includes, for example, two loop-shaped conductor structures 110 that are arranged around rod-shaped supporting structures 120 (e.g., a carrier material with a flat coil element 110 that is wound around round rods 120). As a result of this manner of arrangement, the overall arrangement may be reversibly bent at least around the axis A.

Figure 12:
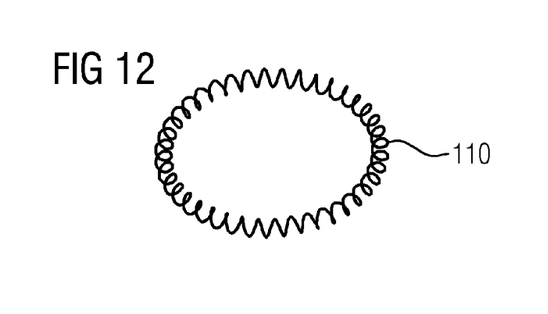
FIG. 12 shows a diagrammatic view of one embodiment of a conductor structure that is flexible throughout.

Conductor structures that are flexible at least in sections are also suitable for the realization of ductile and/or pliable conductor structures. This is illustrated based on the exemplary embodiments that are shown in FIGS. 12 to 14.

As a result of the ductility of springs, for example, in connection with recoil strength, a spring structure represents a good opportunity for geometric adaptation. Thus, the example shown in FIG. 12 shows a continuously flexible loop as a conductor structure 110, the shape and size of which may be adapted.

Figure 13:
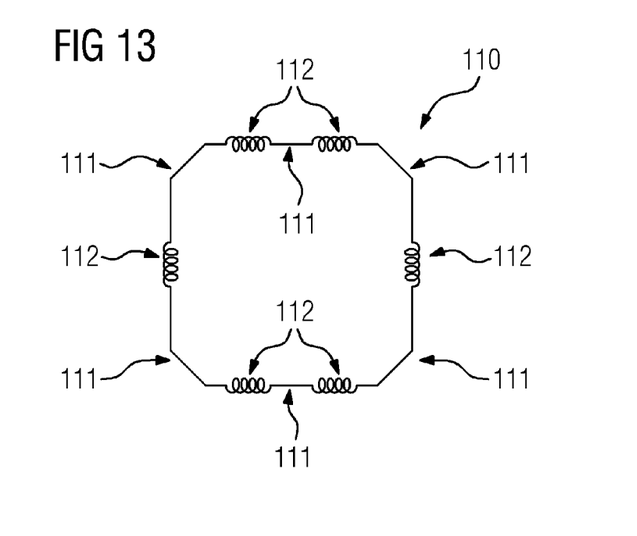
FIG. 13 shows a diagrammatic view of one embodiment of a conductor structure that is flexible in sections.

In contrast, FIG. 13 shows a variant with a partial-spring structure (e.g., the conductor structure 110 includes, for example, six rigid areas 111 and six flexible areas 112). A conductor structure according to one or more of the present embodiments may also have more or less rigid and/or flexible areas. The flexible areas have, for example, springs that are designed as coil springs. As a result of the flexible areas, the overall arrangement is also flexible. The electrical conductivity and consequently also indirectly the quality of a coil element that may surround the conductor structure 110 may be influenced by the material including the spring.

Figure 14:
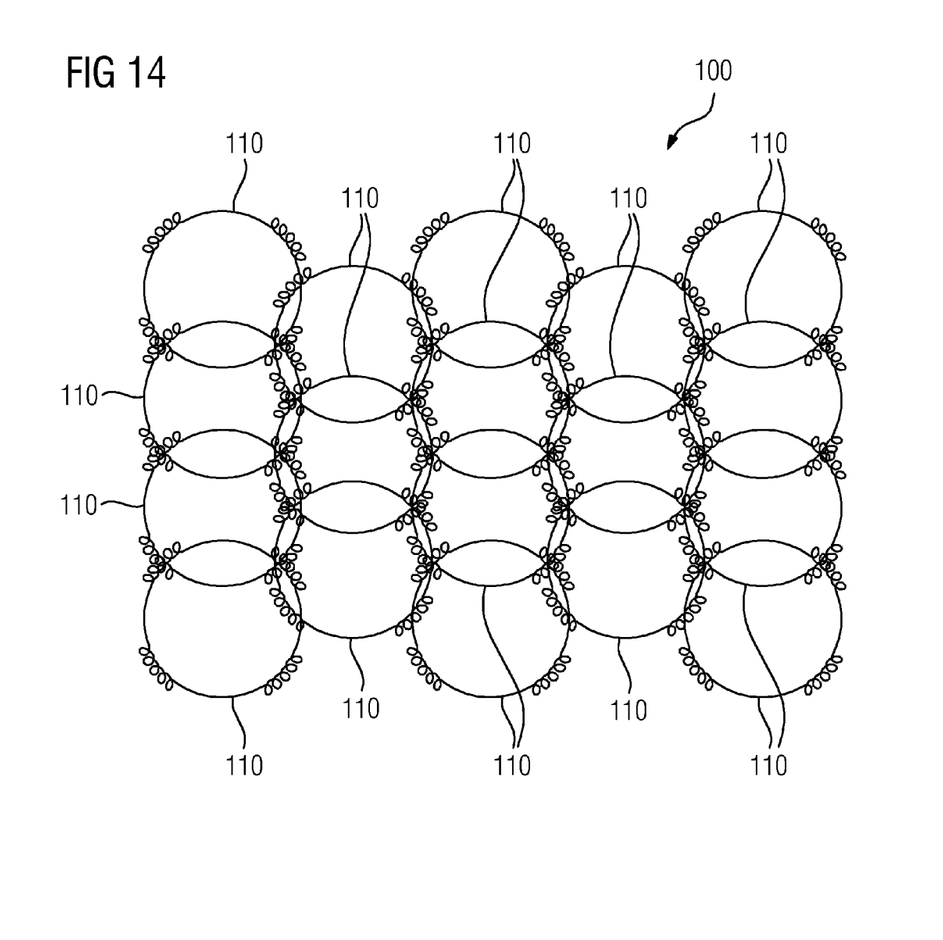
FIG. 14 shows a diagrammatic view of one embodiment of an array of conductor structures that are flexible in sections.

FIG. 14 shows an array with eighteen conductor structures 110 as a local coil 100 (e.g., each of the conductor structures 110 corresponds to one coil element). An array may also include more or less conductor structures. Each of the conductor structures 110 includes four rigid areas and four flexible areas. The rigid areas are, for example, formed by rigid copper conductors. The flexible areas may, for example, have a copper mesh and/or other flexible conductive material. The conductor structures 110 may have a diameter of 6 to 18 cm. The conductor structures 110 are advantageously interconnected in the respective rigid areas.

The flexible sections of the conductor structures may, for example, include coil springs and/or conical springs and/or telescopic springs and/or flat springs. In one embodiment, the flexible sections include textile fabrics, as shown in an exemplary manner in FIGS. 4 to 9, as textile fabrics may also display flexible properties.

Figure 15:
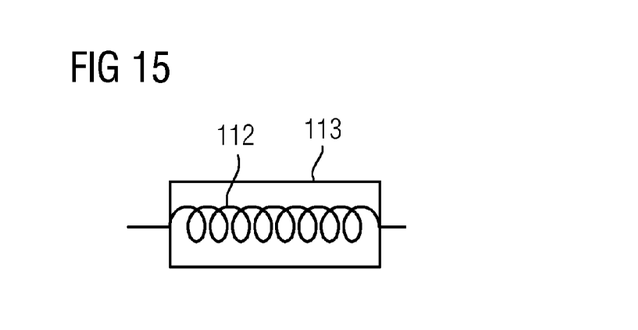
FIG. 15 shows a diagrammatic view of a section of one embodiment of a conductor structure with a protective sleeve.

FIG. 15 shows a spring 112 with a protective sleeve 113 that protects the spring 112 from damage.

The aforementioned products described in detail are only exemplary embodiments that may be modified in many different ways by a person skilled in the art without departing from the scope of the invention. The use of the indefinite article "a" and/or "an" does not rule out the possibility of the features concerned being duplicated.

In summary, by way of the present embodiments, a flexible local coil may be provided, for example, in three spatial directions. This is achieved by at least one conductor structure being at least partially ductile and/or pliable in design.

A single-coil element that may be formed with the aid of a conductor structure may therefore not only be flexible in design but also ductile (e.g., the surface enclosed by a single-coil element may be reduced and enlarged in a specific area). This ductility may be used to adjust a local coil array including several single-coil elements to various (e.g., human) anatomies.

This adaptability may, for example, be produced by electrically conductive springs, by wire mesh, conductive coated ductile basic materials, and/or other ductile electrically conductive materials.

As a result of adaptability, local coils that may be used for the examination of various areas of the body such as, for example, the abdomen, hip, knee, ankle, shoulder, etc. may be produced. Fewer specific local coils are therefore required. Patient comfort, handling, the workflow, and the fitness for purpose of local coils are simplified and improved.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil comprising:
   at least one conductor structure comprising one or more rigid sections and one or more flexible sections,
   wherein the at least one conductor structure is electrically conductive,
   wherein the at least one conductor structure is at least partially ductile, pliable, or ductile and pliable, and
   wherein the one or more flexible sections of the at least one electrically conductive conductor structure comprise at least one coil spring.

2. The local coil of claim 1, wherein the at least one conductor structure comprises carbon nanotubes.

3. The local coil of claim 1, wherein the at least one conductor structure comprises single strands, solid wires, or single strands and solid wires.

4. The local coil of claim 1, wherein the at least one conductor structure has at least one textile fabric.

5. The local coil of claim 4, wherein the at least one textile fabric is woven, crocheted, knitted, braided, twisted, or any combination thereof.

6. The local coil of claim 4, wherein the at least one textile fabric is spatially designed.

7. The local coil of claim 4, wherein the at least one textile fabric is flat in design.

8. The local coil of claim 1, wherein the at least one conductor structure comprises a plurality of conductor structures with a same preferred direction.

9. The local coil of claim 1, wherein the at least one conductor structure comprises a plurality of conductor structures that are crossed over.

10. The local coil of claim 1, further comprising at least one supporting structure.

11. The local coil of claim 10, wherein the at least one supporting structure is at least partially ductile, pliable, or ductile and pliable.

12. The local coil of claim 10, wherein the at least one conductor structure is arranged on the at least one supporting structure.

13. The local coil of claim 10, further comprising a plurality of supporting structures that are arranged in parallel to each other.

14. The local coil of claim 1, wherein the at least one conductor structure follows a zigzag-shaped course, a meandering course, or a combination thereof.

15. The local coil of claim 1, wherein the at least one conductor structure is arrangeable on a cylinder.

16. The local coil of claim 1, wherein the at least one spring comprises at least one conical spring, telescopic spring, flat spring, or any combination thereof.

17. The local coil of claim 1, further comprising at least one protective sleeve that is arranged around the at least one conductor structure.

18. The local coil of claim 1, further comprising at least one matching circuit.

19. The local coil of claim 1, wherein the at least one conductor structure comprises an elastic conductor structure.

20. A magnetic resonance device comprising:
a local coil comprising:
at least one conductor structure comprising one or more rigid sections and one or more flexible sections,
wherein the at least one conductor structure is electrically conductive, wherein the at least one conductor structure is at least partially ductile, pliable, or ductile and pliable, and
wherein the one or more flexible sections of the at least one electrically conductive conductor structure comprise at least one coil spring.

* * * * *